United States Patent [19]
Yoshimura et al.

[11] 3,940,702
[45] Feb. 24, 1976

[54] AUTOMATICALLY PRESETTING CHANNEL SELECTING SYSTEM

[75] Inventors: Jun'Ichi Yoshimura; Tatsumi Watabe, both of Yokohama, Japan

[73] Assignee: Alps Electric Co., Ltd., Tokyo, Japan

[22] Filed: Oct. 7, 1974

[21] Appl. No.: 512,551

[30] Foreign Application Priority Data
Nov. 7, 1973   Japan............................. 48-125195

[52] U.S. Cl.................................. 325/464; 325/470
[51] Int. Cl.²............................................. H04B 1/32
[58] Field of Search........... 325/332, 335, 337, 416, 325/420, 422, 455, 469, 470, 453, 464, 465; 334/15; 331/179, 180; 324/77 B, 77 CS, 77 R, 79 R, 790; 340/173 AM, 174 R

[56] References Cited
UNITED STATES PATENTS

| | | | |
|---|---|---|---|
| 3,651,411 | 3/1972 | Zlotnick | 334/15 |
| 3,821,651 | 6/1974 | Fathauer et al. | 325/470 |
| 3,845,394 | 10/1974 | Hamada | 325/455 |

*Primary Examiner*—Benedict V. Safourek

[57] ABSTRACT

A channel selecting system for use in a receiver having a voltage controlled tuning element which has an automatic channel presetting function which utilizes a pulse generator and a binary counter connected to the generator to count the pulses and to generate a binary coded output in accordance with the sum of the pulses. A digital-to-analog converter changes the binary coded output into a linearly increasing tuning sweep voltage which in turn conditions the voltage controlled tuning element to scan the frequency range of the tuner as the tuning voltage increases. As the frequencies are scanned, a detector, connected to the tuning element, senses the presence of a broadcast channel. When a channel is detected, the scan is interrupted and a binary memory is utilized to store the binary coded output which corresponds to the frequency of the detected broadcast channel. A control gate signal generator driven by the detector controls the pulse generator and memory such that the scan is continued until the entire frequency range has been scanned. Channel selection is accomplished by switch means actuatable to address the memory to read out a selected binary code output corresponding to the channel desired which causes the converter to generate a voltage to condition the tuning element to tune to the desired frequency. The voltage control tuning element may comprise several different elements, one for each of a plurality of different frequency ranges. Means are provided for selecting an appropriate tuner such that channels from any of the frequency ranges may be selected.

4 Claims, 3 Drawing Figures

AUTOMATICALLY PRESETTING CHANNEL SELECTING SYSTEM

The present invention relates to a channel selecting system and more particularly to a channel selecting system having an automatic channel preset function for use in a receiver having an electronic tuning element.

Electronic tuning elements include voltage controlled reactance elements in which the bias voltage of reactance element is varied to condition the tuner to select the appropriate frequency. In electronic tuners presently in use, a given number of preset variable resistors are switched by push button switches or by electronic switching means to vary the reactance of the elements. Therefore, the number of received channels is limited to the number of variable resistors present in the tuner.

Each of the variable resistors must be precisely preset to a predetermined resistance level. This is especially true when a varacter diode is used as the variable reactance element because the voltage-capacitance characteristics of such varactor diodes are often not linear throughout the frequency range. Thus, in order to achieve accurate tuning, considerable amounts of time and precision calibration are required. Moreover, especially in the case of portable communication receivers, presetting of the channel selection system is necessary each time the frequencies of the receivable broadcast channels are changed such as by moving the receiver to a different reception area.

It is, therefore, a prime object of the present invention to provide a channel selecting system whereby the frequencies which may be selected may be preset automatically at any time with minimal effort.

In accordance with the present invention, a channel selecting system for use in a receiver or the like having a voltage controlled tuning element is provided. The system has an automatic channel presetting function which broadly considered consists of a means for generating a linearly increasing sweep voltage the magnitude of which is controlled. The sweep voltage is utilized to condition the voltage controlled tuning element to scan the range of reception frequencies. When a frequency is reached at which broadcast channel is received, the presence of the channel is detected, the scan interrupted and a storage memory utilized to store information relating to the input voltage to the tuner. The scan is then continued until the memory has stored information relating to each voltage level at which the tuner receives a broadcast channel. The generation of the sweep voltage automatically terminates when the entire frequency range of the tuner has been scanned. A memory address system is provided such that after the channel preset function is completed, the memory may be addressed to read out information relating to the voltage necessary to condition the tuner to select a particular channel. In this manner. channel selection is performed.

The specific embodiments of the present invention disclosed herein utilize binary components for the sweep voltage control, memory and address functions and a binary-to-analog converter to change the binary signals generated by the sweep voltage control means into the sweep voltage itself. While this approach is considered highly desirable, it should be appreciated that the concepts set forth herein could be applied in a similar manner to an entirely analog system wherein the components, and in particular, the memory, could function in a purely analog manner thereby eliminating the necessity for the binary-to-analog conversion. Thus, although the embodiments described herein utilize the binary technique, the present invention is not intended to be limited to this approach, nor should it be construed to be so limited. The essence of the present invention which relates to the use of a memory to store information relating to the frequencies of broadcast channels throughout the reception band and the utilization of this information for channel selection purposes is not dependent upon the particular type of memory or support components utilized.

With this in mind, the specific embodiments of the present invention described herein include an automatic channel preset system which when incorporated with the channel selection components perform the necessary tuner conditioning apparatus. The automatic channel preset system includes means for generating an increasing binary coded output and means for converting the binary code output into a linearly increasing sweep voltage the level of which is dependent upon the coded output. The voltage controlled tuning element is conditioned by the increasing voltage level to scan the frequency range of the tuner. Means are provided for detecting the presence of a broadcast channel as the frequencies are scanned. Control means are operably connected to the detecting means and to a storage memory to interrupt the scan and to a binary memory to store the binary coded output corresponding to the frequency of the broadcast channel when a channel is detected by the detector means. The binary coded output generating means is then caused to continue generating binary code outputs such that the voltage continues to sweep the frequency band. The operation is continued until binary coded outputs corresponding to each frequency having a broadcast channel present thereon are stored in the memory. The scan is then terminated.

Channel selection is accomplished by means of an array of keyboard switches which are connected to an encoder circuit. Actuation of the appropriate switch causes the encoder circuit to address the storage memory at a location corresponding to the particular switch actuated. The memory is caused to read out the binary coded output present at the addressed location. This binary coded output is fed to the converting means wherein it is changed into a voltage having a level dependent upon the output from the memory. The voltage electronically conditions the reactance element to select the desired frequency such that the receiver is tuned to the desired broadcast channel.

In a second preferred embodiment of the present invention, the voltage controlled tuning element comprises at least two separate elements each capable of selecting a frequency in a different frequency range. For instance, tuning elements capable of selecting channels in the VHF and UHF ranges, respectively, may be provided. When elements capable of tuning in different frequency ranges are present, means for selecting the appropriate tuning element in accordance with the binary coded output received by the converting means are provided. In this way, the appropriate tuning element is automatically selected.

The selecting means includes a second storage means in the form of a read-only memory which has stored thereon binary coded signals corresponding to voltages capable of conditioning each of the tuning elements to the upper and lower limits of their respective frequency ranges. Means for comparing the binary coded output with the binary coded signals stored on the read-only memory are provided. The comparison means generates an equality signal in the event that the outputs and signals are equal. Means responsive to the equality signal are provided for directing the voltage from the converting means to the input of the appropriate tuning element thus selecting the appropriate tuning range.

In a third preferred embodiment of the present invention, electronic channel indicia means responsive to the binary coded outputs are provided for displaying indicia representative of the channel to which the tuning element is tuned. In addition, this embodiment includes means for detecting the presence of an empty address location in the storage memory thereby providing an indication of when the storage memory is filled to capacity. Moreover, this embodiment includes a switch actuatable to initiate the generation of binary coded outputs from the binary coded output generating means thus causing the system to once again sweep through the available frequency range and re-preset the channel selection system. Further, means are provided causing the memory storage means to sequentially read out each of the binary coded outputs stored therein so that automatic sequential channel selection may be performed.

To the accomplishment of above and to such other objects as may hereinafter appear, the present invention relates to an automatically presetting channel selecting system aas defined in the appended claims and described in the specification taken together with the drawings in which like numerals refer to like parts and wherein:

Figure 1:
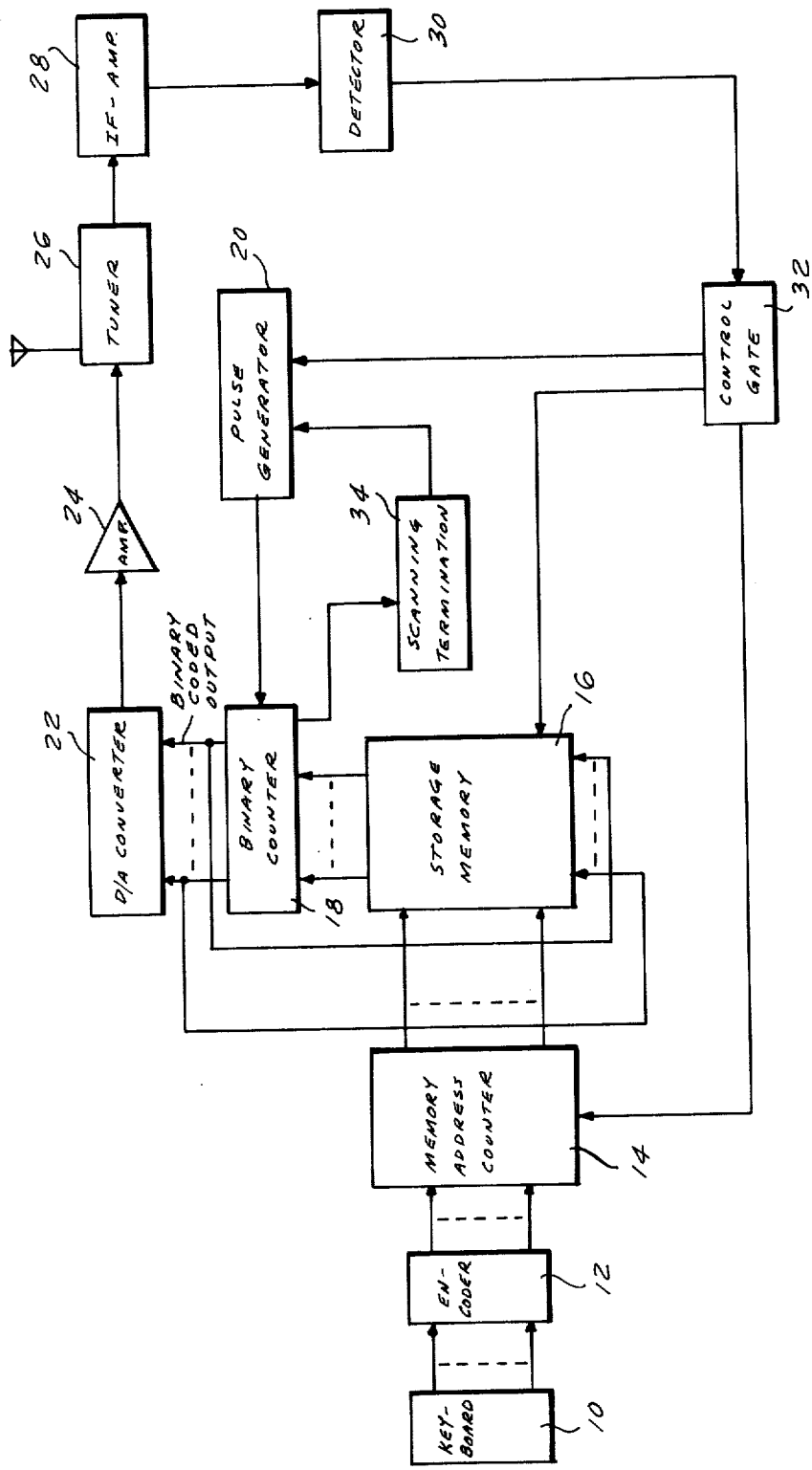
FIG. 1 is a block diagram of a first preferred embodiment of the present invention.

As seen in FIG. 1, the first preferred embodiment of the present invention includes a keyboard 10 comprising an array of depressible push-button switches or the like. Keyboard 10 functions as the input to the circuit and the depression of the appropriate pushbuttons therein will cause the system to tune to the desired frequency. Keyboard 10 is operably connected to an encoder circuit 12 which converts signals from keyboard 10 into binary coded signals. The binary coded signals from the encoder circuit 12 are fed to a memory address counter 14 which is utilized to address a read/write storage memory 16.

Memory 16 is utilized to store binary codes which correspond to particular tuning voltages which in turn may be utilized to electronically condition the tuner to select the desired broadcast channels. A binary counter 18, which is utilized to control the scanning function, is operably connected to a pulse generator 20, preferably in the form of a controllable monostable multi-vibrator. A digital-to-analog converter 22 is operably connected to scanning counter 18 to convert the binary code output from memory 16 or scanning counter 18 into the corresponding tuning voltage. The tuning voltages from converter 22 are supplied to a buffer amplifier 24 and then to the voltage controlled tuning element 26. Element 26 is coupled to an intermediate amplifier 28 in a manner conventional in communication receivers.

A detector circuit 30 is operably connected to intermediate frequency amplifier 28 and is utilized to detect the presence of a broadcast channel at the frequency to which tuner 26 is tuned. Detector circuit 30 drives control gate circuit 32 which in turn controls memory address counter 14, storage memory 16 and pulse generator 20. A scanning termination signal generator 34 is operably connected between scanning counter 18 and pulse generator 20. Scanning termination signal generator 34 detects the end of the tuning sweep cycle and causes the pulse generator to cease generating pulses, thereby stopping the automatic presetting function.

The automatic presetting sequence for channel selection is initiated by a power switch (not shown) which is actuated to energize the circuit and to clear the memory address counter 14 and scanning counter 18 such that all bits of the binary code contained in each of these counters are changed to zeros. Simultaneously, monostable multi-vibrator 20 commences operation to supply output pulses to scanning counter 18. Scanning counter 18 counts the pulses from pulse generator 20 and generates a binary coded output which is the sum of the number of pulses previously generated by the pulse generator. Digital-to-analog converter 22 receives the binary coded output from scanning counter 18 and generates a linearly increasing analog voltage, referred to as a sweep voltage, through amplifier 24 to electronic tuning element 26. When the sweep voltage obtains a level such that a broadcasting channel is received by the tuning element 26, detector circuit 30 detects the presence of the received broadcast channel by monitoring changes in intermediate frequency amplifier 28. Detector circuit 30 then generates an output to control gate 32 which in turn supplies suitable control signals to signal generator 20, storage memory 16 and memory address counter 14.

The control signals from control gate 32 cause pulse generator 20 to temporaily cease generating pulses thereby causing scanning counter 18 to stop its counting function. This in turn causes converter 22 to generate a constant voltage such that tuner 26 remains at the broadcast channel frequency. The control signals from gate 32 cause storage memory 16 to change from the write inhibit condition into the condition wherein information may be written therein. The binary coded output of scanning counter 18 is stored in the storage memory 16 at the address location which is presently indicated by memory address counter 14. Thereafter, the control signals from gate 32 cause memory address counter 14 to be indexed such that the next memory location in memory 16 will be addressed the next time the appropriate control signals from gate 32 cause memory 16 to store the binary coded output from scanning counter 18. After memory address counter 14 is indexed, pulse generator 20 is restarted such that scanning counter 18 once again begins counting thereby causing digital-to-analog converter 22 to continue to generate the sweep voltage. This sequence of operation is repeated until the sweep voltage has caused tuner 26 to scan its entire frequency range. Each time a broadcast channel is detected, the binary coded output corresponding to the frequency of the broadcast channel is stored in the appropriate memory location in memory 16. Thus, at the end of the scan, the storage memory 16 has stored therein a plurality of binary coded outputs each of which corresponds to a different broadcast channel.

Scanning termination signal generator 34 generates a scanning termination signal at the end of the scan. This signal is supplied to pulse generator 20 so as to stop the operation thereof. This signal is also supplied to storage memory 16 such that the memory is once again returned to the write inhibit condition. In this manner presetting operation for channel selection is completed.

Channel selection is performed by actuating the appropriate pushbutton on keyboard 10. The actuation of a pushbutton on keyboard 10 causes a binary coded signal from encoder 12 to be applied to memory address counter 14. Memory address counter 14 generates the appropriate address signals to storage memory 16 in accordance with the particular pushbutton depressed on keyboard 10. These address signals cause storage memory 16 to non-destructively read out the binary coded output stored at the addressed location. The binary coded output is transferred through scanning counter 18, to digital-to-analog converter 22 wherein it is converted into a tuning voltage. The tuning voltage is supplied to tuner 26 through amplifier 24 to electronically condition tuner 26 to select the desired channel. Each time a different pushbutton is depressed on keyboard 10, a different memory location in storage memory 16 is addressed and a binary coded output, corresponding to the particular button depressed, is nondestructively read out of storage memory 16 and converted into a tuning voltage which is utilized to condition tuner 26 to select the desired channel.

Thus, until scanning termination signal generator 34 generates the scanning termination signal, binary coded outputs corresponding to the tuning voltages are sequentially stored in storage memory 16 each time a reception of a broadcast channel is detected by detector circuit 30. In this manner, binary coded outputs corresponding to all of the receivable channels are stored in storage memory 16 within a short time interval and it is, therefore, possible to perform the presetting operation each time the power switch is turned on. However, it is also possible to perform the presetting operation at any arbitrary time by the use of a specially provided switch or the like, as described below. In addition, if particular information bits, for instance, zeros, are stored at memory locations in storage memory 16 corresponding to frequencies wherein no broadcast channel is detected, it is possible to make use of this information to squelch or mute signals in order to eliminate the output of the detector circuit 30 in the receiver. However, this function will, of course, be limited by the capacity of storage memory 16.

Figure 2:
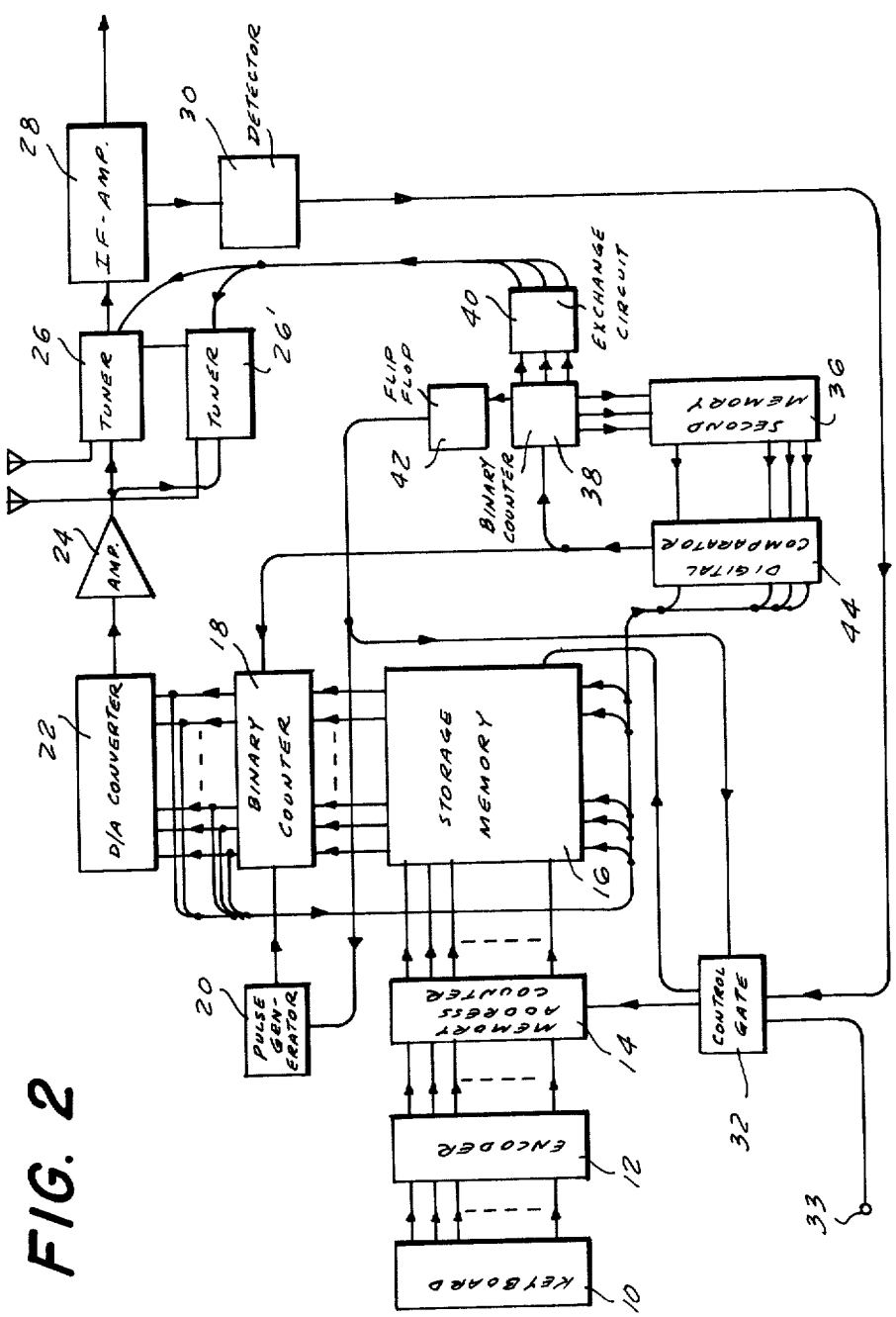
FIG. 2 is a block diagram of a second preferred embodiment of the present invention.

FIG. 2 illustrates the second preferred embodiment of the present invention. In this embodiment all of the components previously described and illustrated in FIG. 1 are present. These components are connected and function in precisely the same manner as previously described. However, in this embodiment, tuner 26 comprises two separate elements 26 and 26'. Each of these tuning elements is conditionable to select a particular frequency from a different frequency range. For example, tuner 26 may be capable of tuning in the VHF range whereas tuner 26' may be capable of tuning in the UHF range. A secondary memory, in the form of read-only binary memory 36 is provided for storing binary codes corresponding to the upper and lower limits of the sweep voltage in each frequency range. An additional binary counter 38 is utilized in conjunction with an exchange circuit 40 to select the appropriate tuner in accordance with the channel to which the receiver is tuned. In addition, a flip-flop circuit 42 is, in this embodiment, substituted for scanning termination signal generator 34 of the previous embodiment. Flip-flop circuit 42 performs the same function as scanning termination signal generator 34, namely, it causes signal generator 20 to cease generating pulses when the presetting operation is completed.

In addition, a digital comparator 44 is operably connected to second memory 36 and binary counter 18. Digital comparator 44 compares the signals from second storage memory 36 (which are binary coded output signals corresponding to the upper and lower limits of the frequency ranges of each of the tuners 26 and 26') with the binary coded output from scanning counter 18 (which will be generated by memory 16 during channel selection or by the scanning counter 18 during the presetting operation).

When digital comparator 44 detects an output from binary counter 18 which is equivalent to one of the stored binary coded signals on second storage memory 36, it generates an equality signal to scanning counter 18 in order to reset the binary coded output of scanning counter 18. Simultaneously, the equality signal is supplied to binary counter 38 such that the binary coded output from binary counter 38 is transmitted through exchanging circuit 40 to the input terminals of tuner elements 26 and 26' thereby automatically selecting the appropriate tuner element 26 or 26' depending upon the frequency range in which the selected frequency is present. Thus, exchange between the high VHF band, the low VHF band and UHF band, for example, may be accomplished and the presetting operation for channel selection may be performed over all of these bands. The termination of the presetting operation is detected by the binary counter 38, the detecting output of which is applied to flip-flop circuit 42 which in turn stops the operation of pulse generator 20. In addition, it should be noted that in this embodiment, provision is made for the external control of control gate 32 through input terinal 33. Terminal 33 is connected to the appropriate external circuit (not shown) such that certain functions of the system can be controlled externally, if desired.

Figure 3:
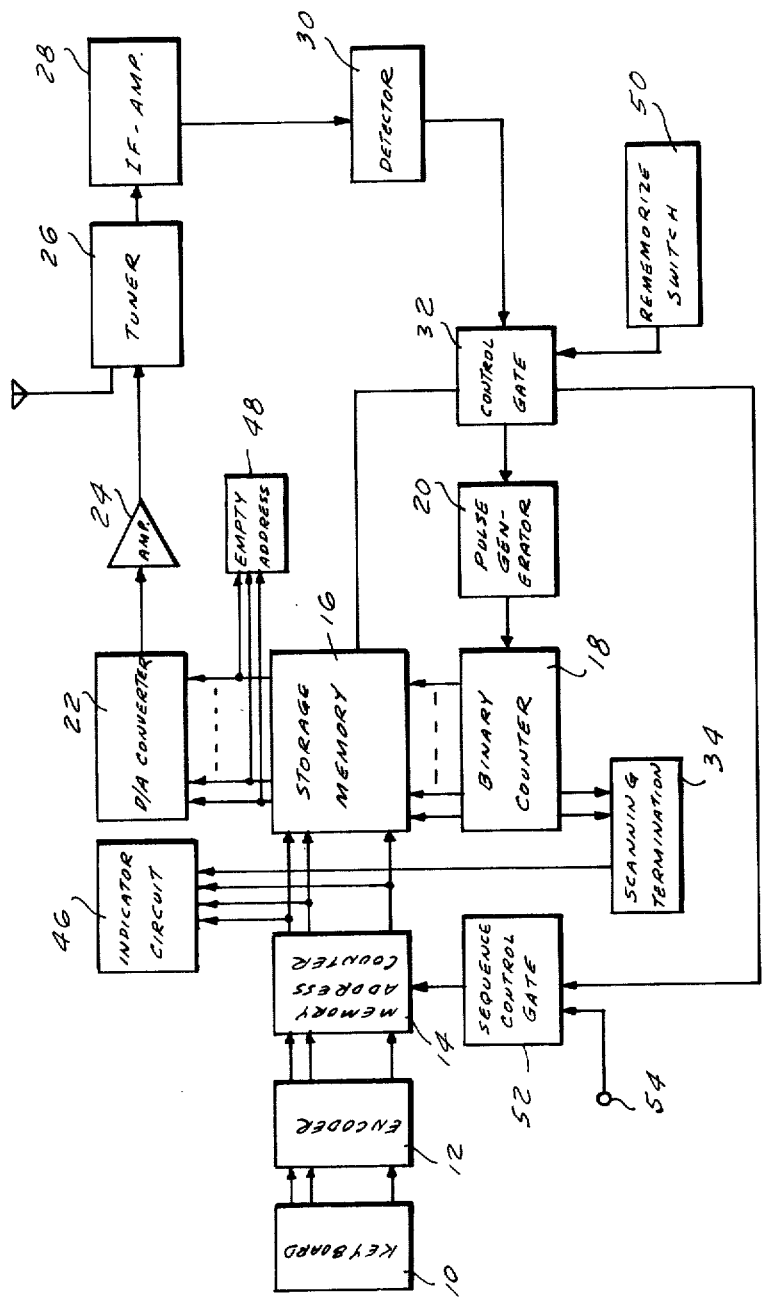
FIG. 3 is a block diagram of a third preferred embodiment of the present invention.

FIG. 3 shows a third preferred embodiment of the present invention. This embodiment of the present invention includes all the components of the first preferred embodiment connected together and functioning in the manner described above. In addition, however, the third preferred embodiment includes an indicating circuit 46, an empty address detecting circuit 48, a rememorizing switch 50 and a sequence control gate 52. These components, while shown herein for illustrative purposes as forming a part of the circuitry of the first embodiment, could also be incorporated into the system of the second embodiment, if desired. Thus, in FIG. 2 a memorizing switch 50 could be connected as an additional input to control gate 32 and sequence control gate 52 could be used to condition memory address counter 14. Likewise indicating circuit 46 could be used in the system if the appropriate connections are made.

As shown in FIG. 3, indicating circuit 46 is operably connected to memory address counter 14 and converts the binary coded signals therefrom into indication signals such as which could be utilized to drive a channel indicia device (not shown) such as a plurality of indication lamps which are capable of displaying a numeral corresponding to the channel selected by the tuner. Empty address detecting circuit 48 is operably connected to the output of storage memory 16 and indicates whether or not any empty address locations are present in storage memory 16. This circuit can be utilized to indicate when storage memory 16 is full to capacity thereby advising the operator of the receiver that no additional channels can be preset into the system.

Rememorizing switch 50 is operably connected to control gate 32. The output from rememorizing switch 50 causes control gate 32 to generate the appropriate signals to restart pulse generator 20 and to condition storage memory 16 into the write mode. Thus, the actuation of rememorizing switch 50 causes the initiation of the presetting operation. It is preferable to provide such a switch in a portable receiver because of the different broadcasting channels which may be present in different reception localities.

Sequence control gate 52 applies control pulses from terminal 54 (connected to an external pulse generator not shown) to memory address counter 14. The sequence control pulses from gate 52 override signals from control gate 32 such that the memory contents may be sequentially read out for automatic sequential channel selection. In addition, since storage memory 16 is retained in the write inhibit condition except during the presetting operation, the embodiment of FIG. 3 permits the binary coded output from scanning counter 18 to be directly coupled to digital-to-analog converter 22.

Thus, the disclosed embodiments of the present invention provide a system wherein broadcast channels within the reception range are automatically memorized by the use of binary codes such that it is possible to freely select the desired channel through the use of an input means such as a keyboard comprised of an array of depressible pushbuttons or the like. In addition, it is possible to preset the system automatically to each of the receivable broadcasting channels without regard to the variations in the voltage-capacitance characteristic of the varactor diodes used as variable reactance elements. Thus, the channel selecting system does not require difficult and time consuming presetting operations and easy revision of the number of receivable channels may be accomplished by merely changing the memory capacity as opposed to completely reconstructing the tuning element. Further, the presetting operation may be reinitiated at any time by merely pushing a button such that variations in the channels received due to a change in location of the receiver may be taken into account. Moreover, the tuning system of the present invention has a relatively compact construction which is designed for long life and ease of operation.

While but a limited number of preferred embodiments of the present invention have been described herein for purposes of illustration, it should be appreciated that variations and modifications may be made therein. For instance, an analog storage memory could be used in conjunction with appropriate apparatus to the generation of the sweep voltage directly thereby eliminating the necessity for digital to analog conversion. In this instance, of course, the associated circuitry could be replaced by appropriate circuitry functioning in the analog mode. It is intended to cover all of these variations and modifications which fall within the scope of the present invention as defined by the appended claims.

What is claimed is:

1. A channel selecting system for use in a receiver or the like having a first voltage controlled tuning element capable of tuning in a first frequency range and a second voltage control tuning element capable of tuning in a second frequency range, said system comprising means for detecting the presence of a broadcast signal at a selected frequency, means for generating a first data signal corresponding to the voltage level necessary to condition one of said elements to tune said frequency, storage means, control means operably connected to said detecting means and said storage means for actuating said storage means to store said first data signal, means for generating a voltage in accordance with said first data signal, a selected one of said tuning elements being conditionable by said voltage to select a frequency in accordance therewith, a read-only memory having stored therein second data signals corresponding to voltages capable of conditioning each of said first and second tuning elements to the upper and lower limits of their respective frequency ranges, means for comparing said first data signals with said second data signals and for generating an equality signal in the event said signals are equal and means for selecting one of said first and said second tuning elements in accordance with said equality signal.

2. The system of claim 1 wherein said voltage generating means comprises a digital to analog converter, a pulse generator and a counter, said converter being operably connected to said counter to generate a voltage which is a function of the entry on said counter, said pulse generator being operatively connected to said counter to index same to produce said first data signals, said read-only memory having second data signals stored therein corresponding to the entries in said counter which will cause said converter to generate voltages capable of conditioning each of said first and second tuning elements to the upper and lower limits of their respective ranges.

3. The system of claim 2 comprising a second counter operatively connected to said comparing means and said pulse generator for deactuating said pulse generator when the entry in said second counter equals the second data signal in said read-only memory corresponding to the upper limit of the range of one of said tuning elements.

4. The system of claim 1 further comprising means for detecting the presence of an empty address location in said storage means.

* * * * *